(12) United States Patent
Vandel

(10) Patent No.: US 9,118,316 B2
(45) Date of Patent: Aug. 25, 2015

(54) LOW VOLTAGE MULTI-STAGE INTERLEAVER SYSTEMS, APPARATUS AND METHODS

(75) Inventor: Eric Vandel, Concise (CH)

(73) Assignee: SEMTECH CORPORATION, Camarillo, CA (US)

( * ) Notice: Subject to any disclaimer, the term of this patent is extended or adjusted under 35 U.S.C. 154(b) by 514 days.

(21) Appl. No.: 13/429,527

(22) Filed: Mar. 26, 2012

(65) Prior Publication Data

US 2013/0249623 A1 Sep. 26, 2013

(51) Int. Cl.
*H03K 5/00* (2006.01)
*H03K 17/00* (2006.01)

(52) U.S. Cl.
CPC .................... *H03K 17/007* (2013.01)

(58) Field of Classification Search
None
See application file for complete search history.

(56) References Cited

U.S. PATENT DOCUMENTS

| | | | |
|---|---|---|---|
| 4,076,986 A * | 2/1978 | Croisier et al. | 377/57 |
| 6,363,026 B1 | 3/2002 | Su et al. | |
| 6,546,166 B1 | 4/2003 | Liu et al. | |
| 6,754,411 B2 * | 6/2004 | Ahmadvand et al. | 385/24 |
| 7,847,846 B1 | 12/2010 | Ignjatovic et al. | |
| 8,441,300 B2 * | 5/2013 | Watanabe et al. | 327/333 |
| 2005/0156653 A1 * | 7/2005 | Joshi et al. | 327/333 |
| 2009/0219054 A1 | 9/2009 | Toumazou et al. | |
| 2010/0109724 A1 * | 5/2010 | Huang et al. | 327/156 |
| 2010/0123520 A1 * | 5/2010 | Shifrin | 330/254 |
| 2011/0074615 A1 * | 3/2011 | Seo et al. | 341/144 |
| 2011/0133841 A1 * | 6/2011 | Shifrin | 330/279 |
| 2012/0262953 A1 * | 10/2012 | Jungreis et al. | 363/17 |

OTHER PUBLICATIONS

International Search Report for U.S. Appl. No. 13/33712 dated Jun. 10, 2013, 10 pages.

* cited by examiner

*Primary Examiner* — Lincoln Donovan
*Assistant Examiner* — Khareem E Almo
(74) *Attorney, Agent, or Firm* — Amin, Turocy & Watson, LLP

(57) ABSTRACT

Described herein is a low-voltage multi-stage interleaver. The interleaver includes at least a first interleaver stage and a second interleaver stage. The first interleaver stage is either blocked or operating in a saturation region. The first interleaver stage facilitates cancellation of DC current, including a biasing current, so that the second interleaver stage receives no DC current input. The second interleaver stage is either blocked or operating in a linear region to allow the second interleaver stage to act as a passive current switch.

20 Claims, 10 Drawing Sheets

LOW VOLTAGE MULTI-STAGE INTERLEAVER SYSTEMS, APPARATUS AND METHODS

TECHNICAL FIELD

This disclosure generally relates to low-voltage circuit design, and specifically to low voltage multi-stage current-mode interleavers.

BACKGROUND

Multi-stage current-mode interleavers are used to multiplex input data over shared media. One application for multi-stage current-mode interleavers is high speed analog to digital conversion. In high speed analog to digital conversion, an input analog signal can be distibuted or interleaved to multiple low speed analog to digital convertors. By interleaving the analog signal, the analog to digital convertor can achieve conversion of the analog input to a digital output at a high speed.

Classical current-mode interleavers are often impractical or undeserable in high speed applications. Such classical current-mode interleavers require a high supply voltage, often several times greater than the saturation voltage of a transistor. Many modern technologies, such as deep submicron technologies, require the supply voltage to be around 1V or below. Higher supply voltages, such as those required by classical current mode interleavers, can damage circuit elements.

SUMMARY

The following presents a simplified summary to provide a basic understanding of some aspects of the subject disclosure. This summary is not an extensive overview of the disclosed subject matter. It is not intended to identify key or critical elements of the disclosed subject matter, nor is it intended to delineate the scope of the subject disclosure. Its sole purpose is to present some concepts of the disclosed subject matter in a simplified form as a prelude to the more detailed description presented later.

In one embodiment of the subject disclosure, a multi-stage current-mode interleaver includes at least a first interleaver stage and a second interleaver stage. Both the first interleaver stage and the second interleaver stage include transistors that act as current-mode switches. The first interleaver stage operates in the saturation region (active state) of the transistors to facilitate active current-mode switching. The first interleaver stage operates by using an input DC biasing current.

After the first interleaver stage operates in the saturation region, the DC biasing current is subsequently cancelled so that the second interleaver stage receives zero (or almost zero) input DC current. Accordingly, the second interleaver stage and all subsequent interleaver stages can operate in the linear (ohmic) region of the transistors to facilitate passive current switching. The first interleaver stage and/or the second interleaver stage can, alternatively, be blocked.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of the embodiments of the subject disclosure. One skilled in the relevant art will recognize, however, that the embodiments described herein can be practiced without one or more of the specific details, or with other methods, components, materials, etc. In other instances, well-known structures, materials, or operations are not shown or described in detail to avoid obscuring certain aspects.

According to an aspect of the subject disclosure, described herein is a multi-stage current-mode interleaver. The multi-stage current-mode interleaver has a lower overall supply voltage requirement compared to the overall supply voltage requirements of classical multi-stage current-mode interleavers.

As described herein, the multi-stage current-mode interleaver includes at least two stages: a first interleaver stage and a second interleaver stage. The first interleaver stage includes transistors that are current switches. The transistors in the first interleaver stage operate either in the saturation region (active mode) as "active current switches" or are blocked. To operate in saturation, the first interleaver stage receives a DC biasing current that biases transistors of the first interleaver stage to operating points within their respective saturation regions (active modes). The first interleaver stage facilitates cancellation of the DC biasing current so that the second interleaver stage does not receive the DC biasing current. Cancellation (or near cancellation) of the DC biasing current allows transistors of the second stage and all successive stages to operate as current switches in the linear or ohmic (or ohmic) region ("passive current switches"). The transistors of the second interleaver stage can, alternatively, be blocked.

Figure 1:
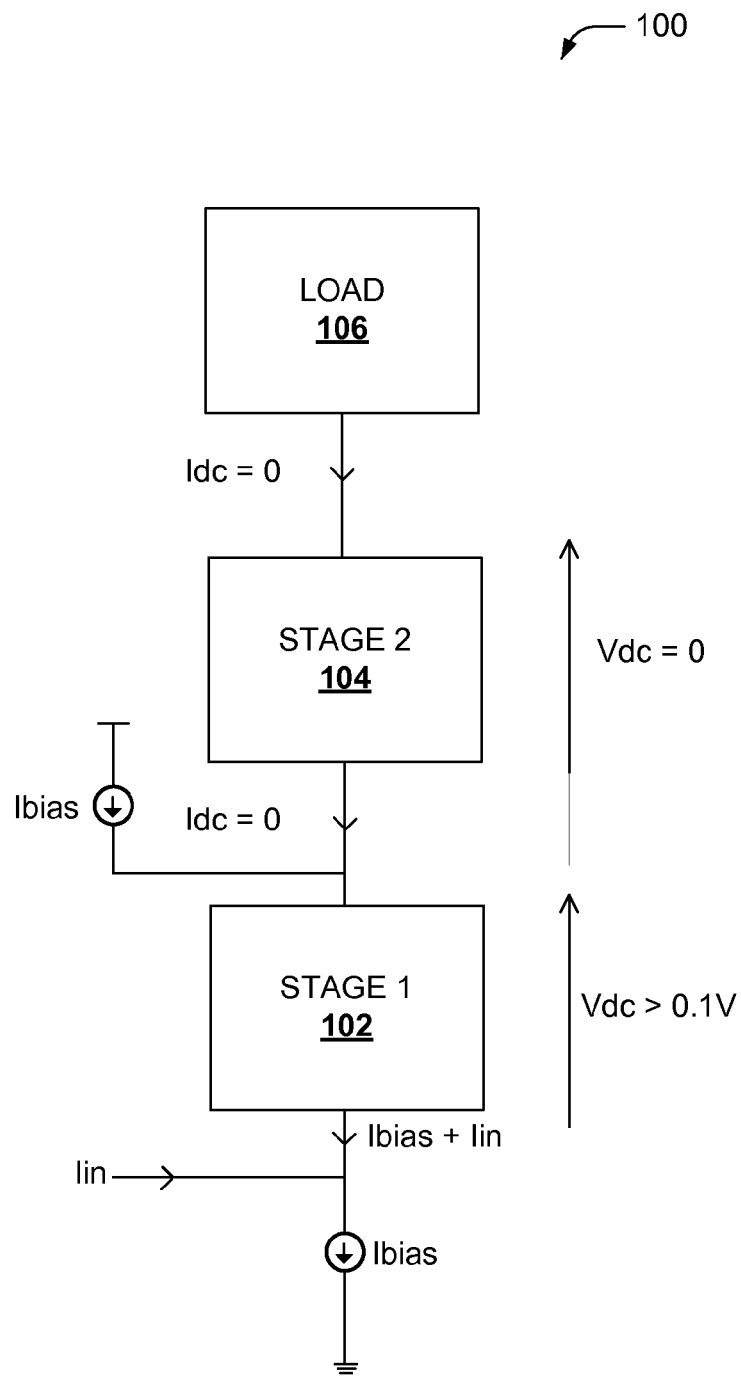
FIG. 1 is a schematic illustration of a multi-stage current-mode interleaver having two stages, according to an embodiment of the subject disclosure.

Referring now to FIG. 1, illustrated is a schematic diagram of a multi-stage current-mode interleaver 100. The multi-stage current-mode interleaver 100 requires lower supply voltages than supply voltages required by conventional current-mode interleavers. The multi-stage current-mode interleaver 100 can be utilized, for example, not limitation, in a high speed analog to digital converter.

The multi-stage current-mode interleaver 100 includes at least a first interleaver stage 102 and a second interleaver stage 104. The multi-stage current-mode interleaver 100 also includes a load 106. Although only two stages 102 and 104 and a load 106 are illustrated in FIG. 1, this is merely for simplicity of illustration. It will be understood that the multi-stage interleaver 100 can include any number of stages (at least two) and any number of loads (at least one). The load 106 can be any circuit element, including an operational amplifier circuit, a capacitor, or the like.

The individual interleaver stages 102 and 104 can themselves include any number of individual interleaver circuits. The individual interleaver stages 102 and 104 are drawn as single boxes with a single input and a single output merely for simplicity of illustration. It will be understood that the individual interleaver stages 102 and 104 can include an input and an output corresponding to each individual interleaver circuit (at least one) within the stage.

Each individual interleaver circuit includes at least one transistor. The at least one transistor can be any type of field-effect transistor (FET). For example, the transistor can be a metal oxide semiconductor (MOS)-type FETs. A MOSFET can act as an analog switch, such as a current switch. The MOSFET can pass current or other analog signals with low resistance when "on" (in either the saturation region (active mode) or the linear (ohmic) region) and can block the current or other analog signal due to high impedance when "off" (blocked).

The multi-stage current-mode interleaver 100 operates according to a current-mode approach. The first interleaver stage 102 facilitates active current switching. The first interleaver stage 102 includes at least two transistors acting as current mode switches while operating in the saturation region (active mode). The second interleaver stage 104 facilitates passive current switching. The second interleaver stage 104 includes at least two transistors acting as current mode switches while operating in the linear (ohmic) region.

The first interleaver stage 102 is an "interleaver by a." An "interleaver by a" has one input and "a" number of separated outputs (when used herein, inputs and/or outputs can be single ended or differential). The value "a" is an integer with a value of at least two. The individual interleaver circuits each include at least one transistor. During operation, the first interleaver stage 102 is either blocked or operating in the saturation region. When the first interleaver stage 102 operates in the saturation region, it is said to be operating in an active mode. In the saturation region, transistors within the interleaver circuits of the first interleaver stage 102 behave as active current switches. It is said herein that the first interleaver stage 102 behaves as an active current switch as shorthand for "the transistors within the interleaver circuits of the first interleaver stage 102 behave as active current switches."

The second interleaver stage is an "interleaver by b." An "interleaver by b" has one input and "b" number of separated outputs. The value "b" is an integer with a value of at least two. The b individual interleaver circuits each include at least one transistor. During operation, the second interleaver stage 104 is either blocked or operating in the linear (or ohmic) region. When the second interleaver stage 104 operates in the linear (or ohmic) region, it is said to be operating in a passive mode. In the linear (or ohmic) region, transistors within the interleaver circuits of the second interleaver stage 104 behave as passive current switches. It is said herein that the second interleaver stage 104 behaves as a passive current switch as shorthand for "the transistors within the interleaver circuits of the second interleaver stage 104 behave as passive current switches."

The first interleaver stage 102 receives an input DC current (Idc is not equal to 0). The input DC current is due to a DC biasing current (Ibias). The DC biasing current (Ibias) drives transistors in the first interleaver stage 102 to an operating point within the saturation region (active mode) of the transistors. As the first interleaver stage 102 receives a non-zero DC current input, the DC voltage drop (Vdc) across the first interleaver stage is non-zero. Due to the currents, the DC voltage drop is greater than 0.1 V (Vdc>0.1 V). In some embodiments, the DC voltage drop is between 0.2 V and 0.3 V.

The first interleaver stage 102 operates in saturation, and employs a mechanism to cancel the DC current (Idc). Thus, the second interleaver stage 104 receives zero (or near zero) input DC current. When described herein, the terms "cancellation of the DC current (Idc), "receives zero input DC current" and the like includes the possibility of near zero current or near cancellation. Cancellation need not be perfect. The input DC current to stages subsequent to the first interleaver stage receive an input DC current that is well below a level that would cause the transistor to operate in saturation (active mode) and low enough to allow the transistor to operate in the linear (ohmic) region.

By not receiving any input DC current that can create an operating point within saturation region, the second interleaver stage 104, and all successive interleaver stages, operate in the linear (or ohmic) region. Operation in the linear or ohmic region does not require a biasing current.

As illustrated in FIG. 1, the biasing current (Ibias) is subtracted again between the first interleaver stage 102 and the second interleaver stage 104. This inversion facilitates the cancellation of the DC biasing current so that stages subsequent to the first interleaver stage 102, such as the second interleaver stage 104, do not experience a DC current (Idc=0). The DC biasing current can be eliminated in any number of ways. In one example, a CMOS transistor and a complementary CMOS transistor can be employed to eliminate the DC biasing current so the DC biasing current is not provided as an input to the second interleaver stage.

The second interleaver stage 104 receives zero DC current (Idc) as input from the first interleaver stage 102 (Idc=0). Additionally, the second interleaver stage 104 does not output a DC current (Idc) to the load 106 (Idc=0). With no input DC current and no output DC current, the second interleaver stage 104 experiences no voltage drop (Vdc=0).

As the second interleaver stage 104 (and all subsequent interleaver stages) have no voltage drop between their respective input and output voltages, this allows the overall supply voltage for the multi-stage current-mode interleaver 100 to be reduced compared to classical current-mode interleavers.

Classical current-mode interleavers cannot cancel the DC current after the first interleaver stage, so successive stages of the classical current-mode interleavers experience voltage drops. These voltage drops requires classical current-mode interleavers to employ supply voltages several times the saturation voltage of one transistor in order to compensate for the voltage drop. The multi-stage current-mode interleaver 100 requires a far lower supply voltage compared to classical current-mode interleavers, at least in part, due to the ability of the second interleaver stage 104 and successive interleaver stages to operate in the linear regions with no voltage drops.

Figure 2:
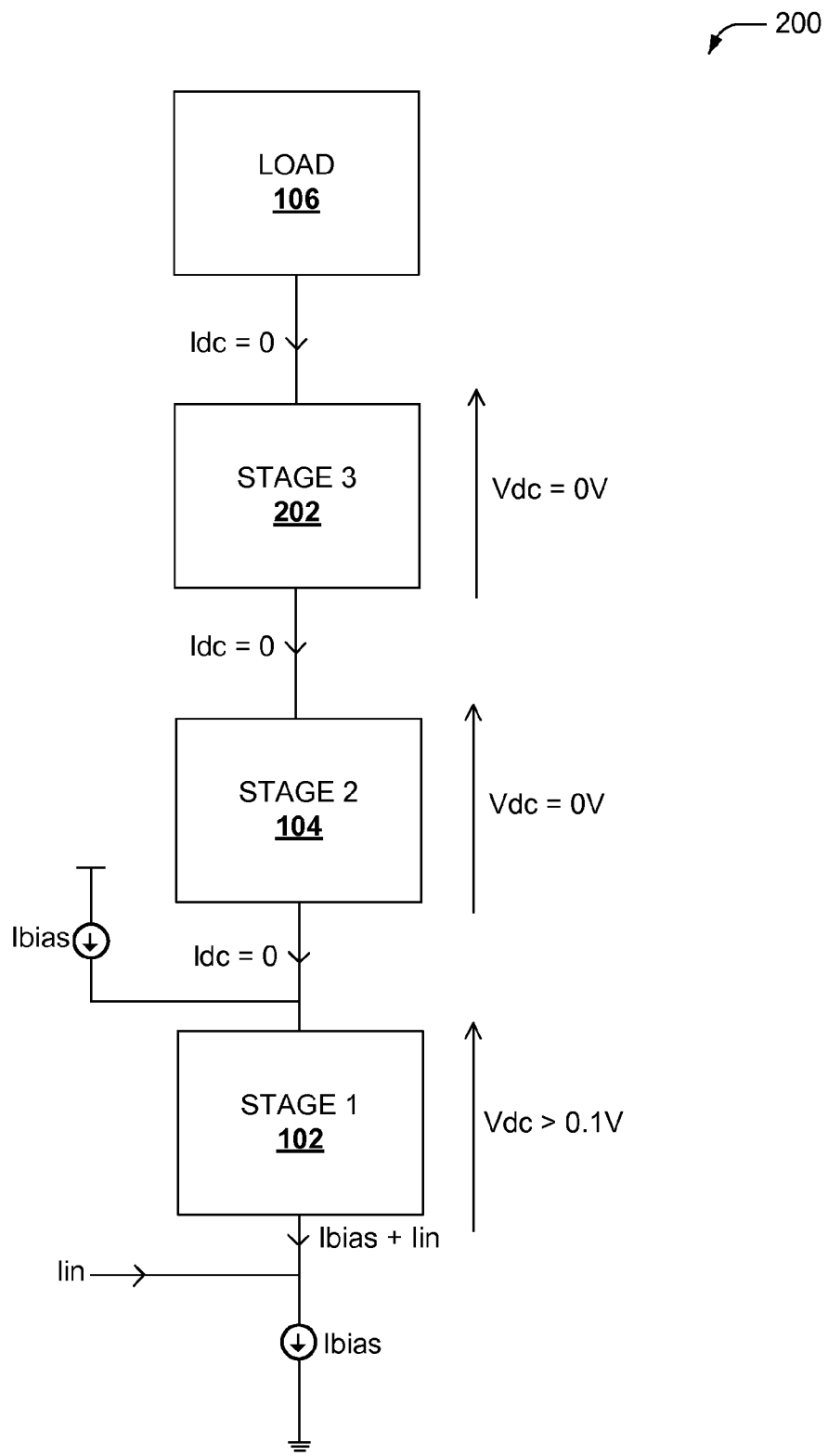
FIG. 2 is a schematic illustration of a multi-stage current-mode interleaver having three stages, according to an embodiment of the subject disclosure.

Referring now to FIG. 2, illustrated is a schematic diagram of a multi-stage current-mode interleaver 200. The multi-stage current-mode interleaver 200 is similar to multi-stage current-mode interleaver 100 in that it includes a first interleaver stage 102, a second interleaver stage 104 and a load 106. However, interleaver 200 also includes an additional third interleaver stage 202. The third interleaver stage 202 is an "interleaver by c." An interleaver by c has one input and "c" number of separated outputs. The value "c" is an integer with a value of at least two. The c individual interleaver circuits each include at least one transistor.

During operation, like the second interleaver stage 104, the third interleaver stage 202 is either blocked or operating in the linear or ohmic region. When the third interleaver stage 202 operates in the linear (or ohmic) region, it is said to be operating in passive mode. In the linear (or ohmic) region, transistors within the interleaver circuits of the third interleaver stage 202 behave as passive current switches. It is said herein that the third interleaver stage 202 behaves as a passive current switch as shorthand for "the transistors within the interleaver circuits of the third interleaver stage 202 behave as passive current switches." The multi-stage current-mode interleaver 200 requires a far lower supply voltage, at least in part, due to the ability of the second interleaver stage 104, the third interleaver stage 202 and any successive interleaver stages to operate in the linear region with no voltage drop across a stage.

Figure 3:
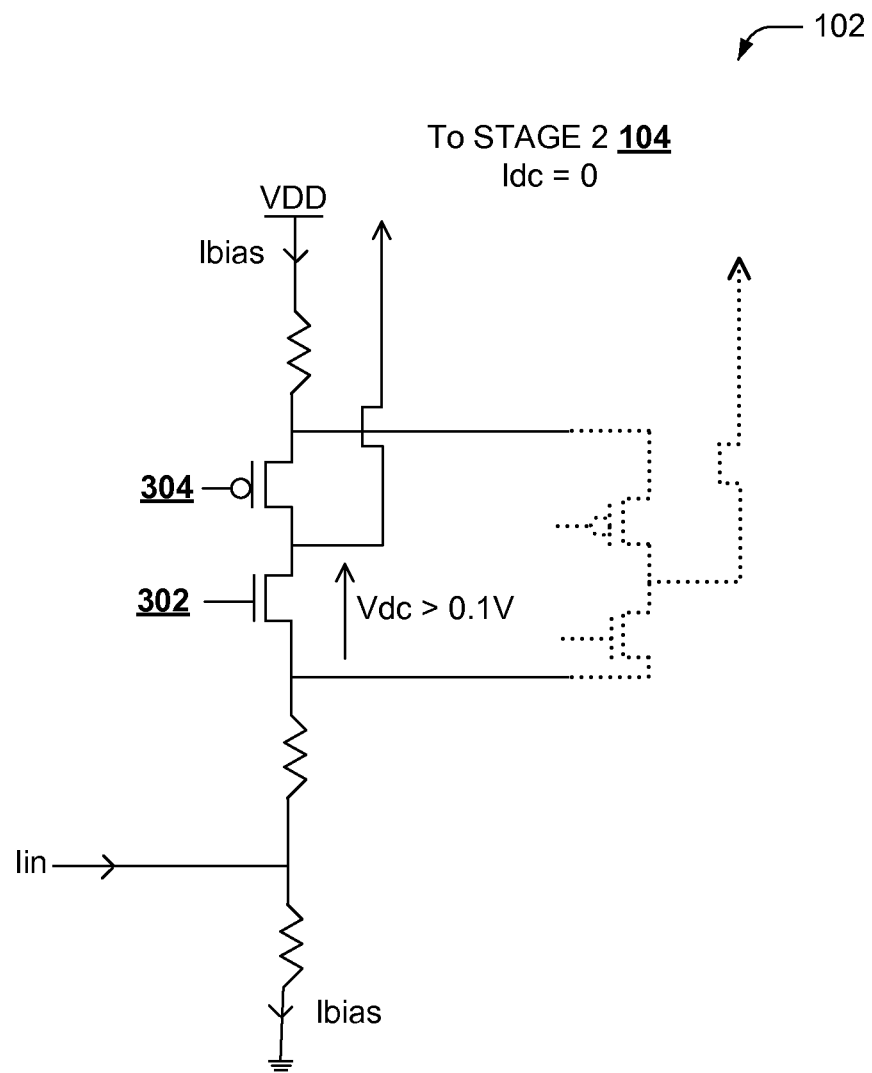
FIG. 3 is a schematic illustration of an interleaver circuit within the first interleaver stage, according to an embodiment of the subject disclosure.

Referring now to FIG. 3, illustrated is a schematic circuit diagram of an interleaver circuit of the first interleaver stage 102. The first interleaver circuit includes a transistor 302 and a complementary transistor 304. The first interleaver stage 102 can include any number or interleaver circuits that are the same as the interleaver circuit shown in FIG. 3. An example second interleaver circuit is shown with dotted lines.

During operation, transistor 302 of the first interleaver stage 102 is either blocked or operating in the saturation region (active mode). So that transistor 302 operates in the saturation region, an operating point within the saturation region of transistor 302 is set by the biasing current (Ibias). The voltage drop across transistor 302 (Vdc) is non-zero. For example, the voltage across transistor 302 (Vdc) is greater than 0.1 V. As another example, the voltage across transistor 302 (Vdc) is between 0.2 V and 0.3 V.

The complementary transistor 304 of the first interleaver stage 102 facilitates cancellation of the biasing current (Ibias). The complementary transistor 304 is an example of one method to facilitate cancellation of the biasing current (Ibias). Other methods of cancelling the biasing current (Ibias) are within the scope of this disclosure. Cancelling the biasing current allows successive interleaver stages, such as the second interleaver stage 104, not to receive the biasing current as a DC current input (Idc=0). As successive stages do not receive the biasing current (Ibias) as input, successive stages do not exhibit a voltage drop. This allows the multi-stage interleaver to operate with a lower supply voltage than the supply voltage required by classical current-mode transistors.

Figure 4:
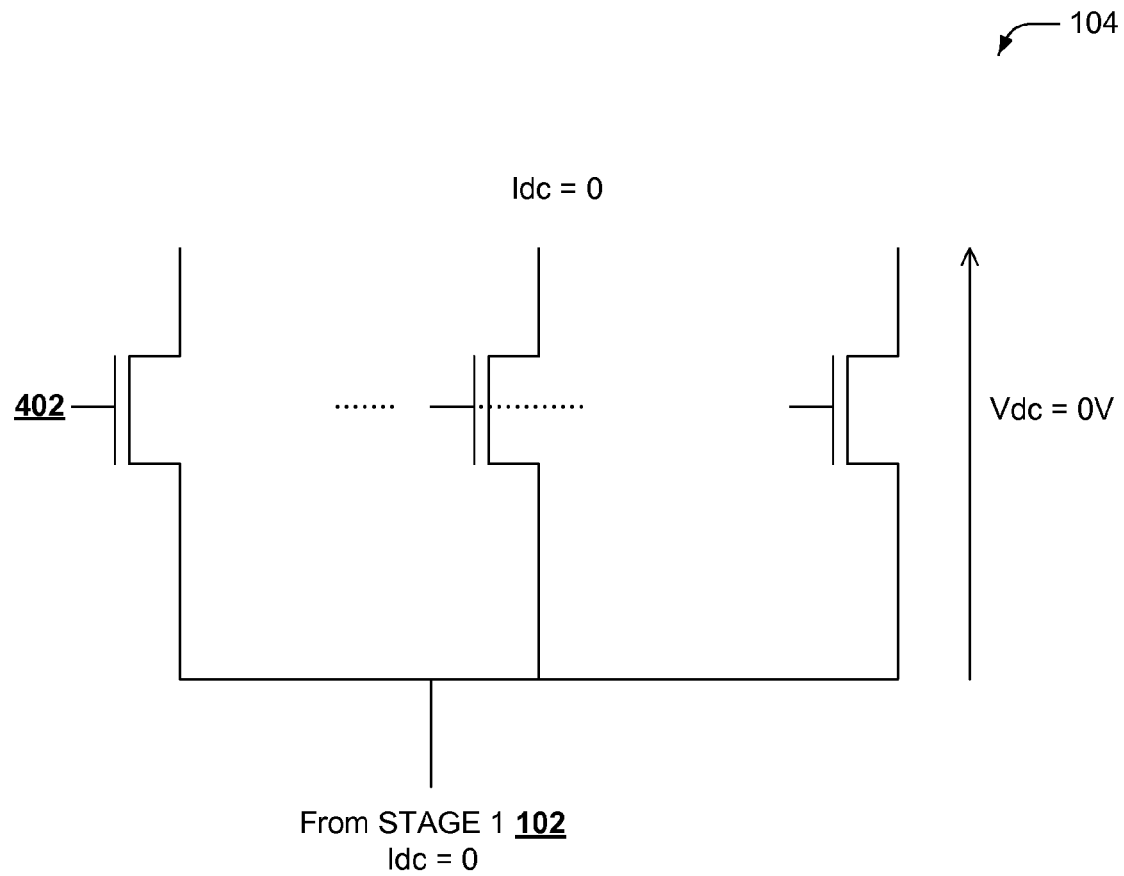
FIG. 4 is a schematic illustration of an interleaver circuit within the second interleaver stage, according to an embodiment of the subject disclosure.

Referring now to FIG. 4, illustrated is a schematic circuit diagram of an interleaver circuit from the second interleaver stage 104. The second interleaver stage 104 includes at least one transistor 402. As the second interleaver stage 104 has no DC current input (Idc=0), the second interleaver stage 104 is not biased to an operating point in the saturation region. Accordingly, transistors of the second interleaver stage 104, such as transistor 402, operate in the linear (or ohmic) region.

The second interleaver stage 104 also outputs no DC current (Idc=0) and experiences no DC voltage drop across the transistors, such as transistor 402 (Vdc=0). Transistors within the successive interleaver stages (e.g. 202) experience no DC current input (Idc=0). The transistors within the successive interleaver stages are not biased to an operating point within their respective saturation regions, so these transistors operate in the linear or ohmic region. Transistors within the subsequent interleaver stages output no DC current (Idc=0), so a load (e.g. 106) also experiences no DC current input (Idc=0).

The second interleaver stage 104 and all successive interleaver stages (e.g. 106, 202) operate as passive current switches. The transistors within the second interleaver stage 104 and all successive interleaver stages operate in the linear (or ohmic range), so these transistors experience no voltage drop across the transistors (Vdc=0). Accordingly, these transistors can be referred to as passive current switches. Transistors from the first interleaver stage 102, in contrast, operate in the saturation region (active mode), so these transistors can be referred to as active current switches.

Figure 5:
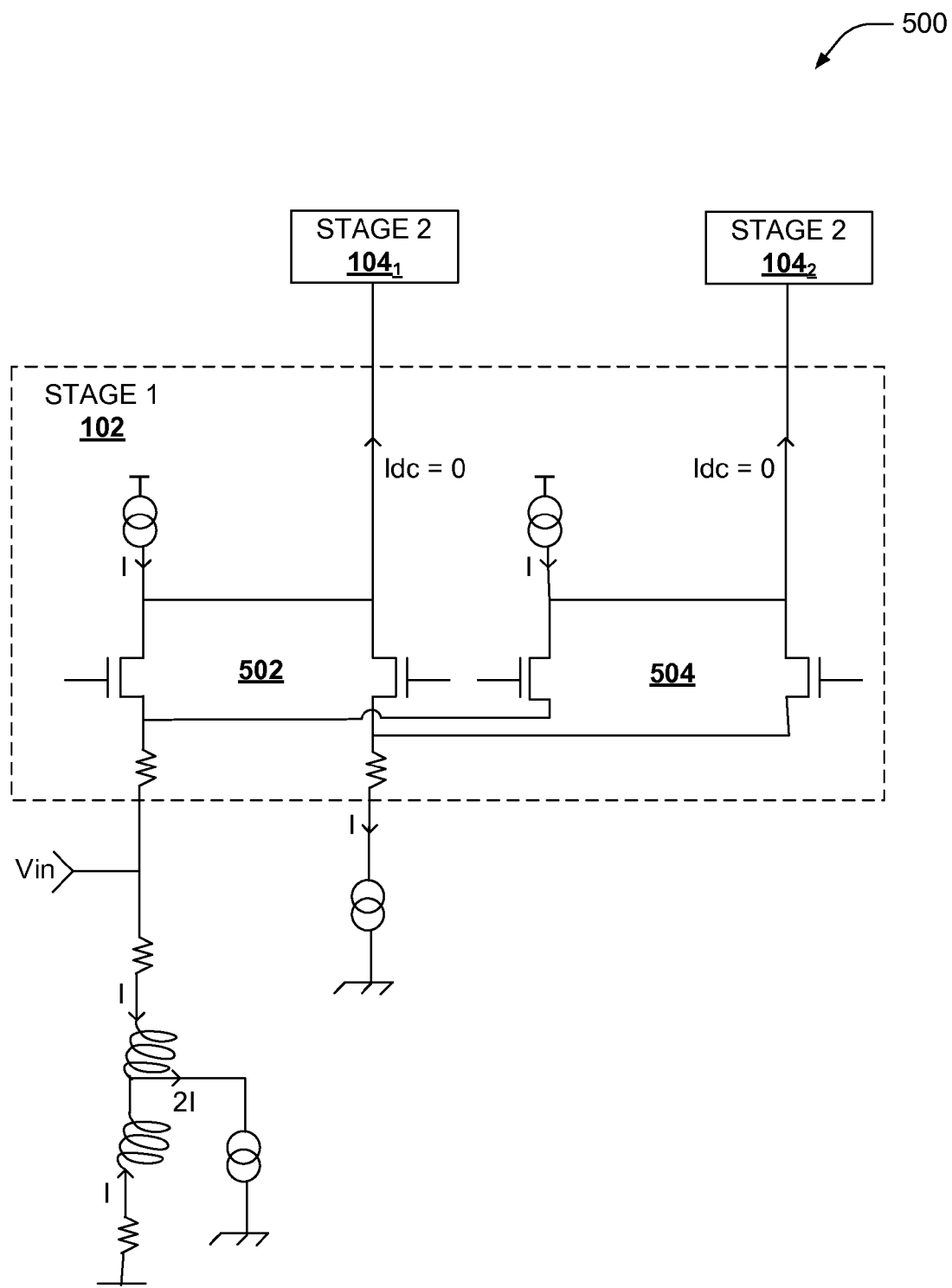
FIG. 5 is a schematic illustration of a multi-stage current-mode interleaver having two interleaver stages, according to an embodiment of the subject disclosure.

Referring now to FIG. 5, illustrated is a schematic diagram of a multi-stage current-mode interleaver 500 having two interleaver stages. The multi-stage current-mode interleaver 500 shows a first interleaver stage 102 and second interleaver stage 104$_1$ and 104$_2$. It will be understood that interleaver 500 can have any number of interleaver stages (at least two). The first interleaver stage 102 is shown to include two individual interleaver circuits 502, 504. As illustrated, the first interleaver stage 102 is an interleaver by 2, or an "int by 2." It will be understood, however, that the first interleaver stage 102 can include any number of interleaver circuits (at least 2) and that two interleaver circuits are drawn merely for simplicity of illustration, not limitation.

The second interleaver stage 104$_1$ and 104$_2$ is illustrated as two boxes, but it will be understood that the second interleaver stage 104$_1$ and 104$_2$ can include any number of interleaver circuits (at least two). For example, the second interleaver stage 104$_1$ and 104$_2$ can be an interleaver by six, or an "int by 6." Additionally, it will be understood that the multi-stage current-mode interleaver 500 can include any number of stages (at least two) and any number of loads (at least one).

The first interleaver stage 102 operates in the saturation region of the transistors 502, 504 within each interleaver circuit of the first interleaver stage 102. The transistors 502, 504 within the first interleaver stage 102 are biased with a DC current (I) so that the transistors 502, 504 are driven to operate at an operating point within their respective saturation regions. The DC current (I) is eliminated after it causes the transistors 502, 504 of the first interleaver stage 102 to operate in saturation. Each of the transistors 502 and 504 are paired with an opposite polarity transistor to facilitate cancellation of the DC current (I).

Accordingly, no DC current is input to the second interleaver stage 104$_1$ and 104$_2$ (Idc=0). This allows transistors within the second interleaver stage 104$_1$ and 104$_2$ to operate in the linear (or ohmic) region. In the linear (or ohmic) region, there is no voltage drop (Vdc=0) and no current is input or output (Idc=0). Accordingly, the second interleaver stage $104_1$ and $104_2$ can act as a passive current switch. As the second interleaver stage does not experience a voltage drop, the only interleaver stage that experiences a voltage drop (V>0.1 V) is the first interleaver stage. Therefore, the supply voltage (Vin) needs only be large enough to compensate for the voltage drop in the first interleaver stage 102 and need not compensate for voltage drop in successive interleaver stages, for example, the second interleaver stage $104_1$ and $104_2$. This allows the interleaver 500 to operate with a lower supply voltage (Vin) than classical current-mode interleavers.

Figure 6:
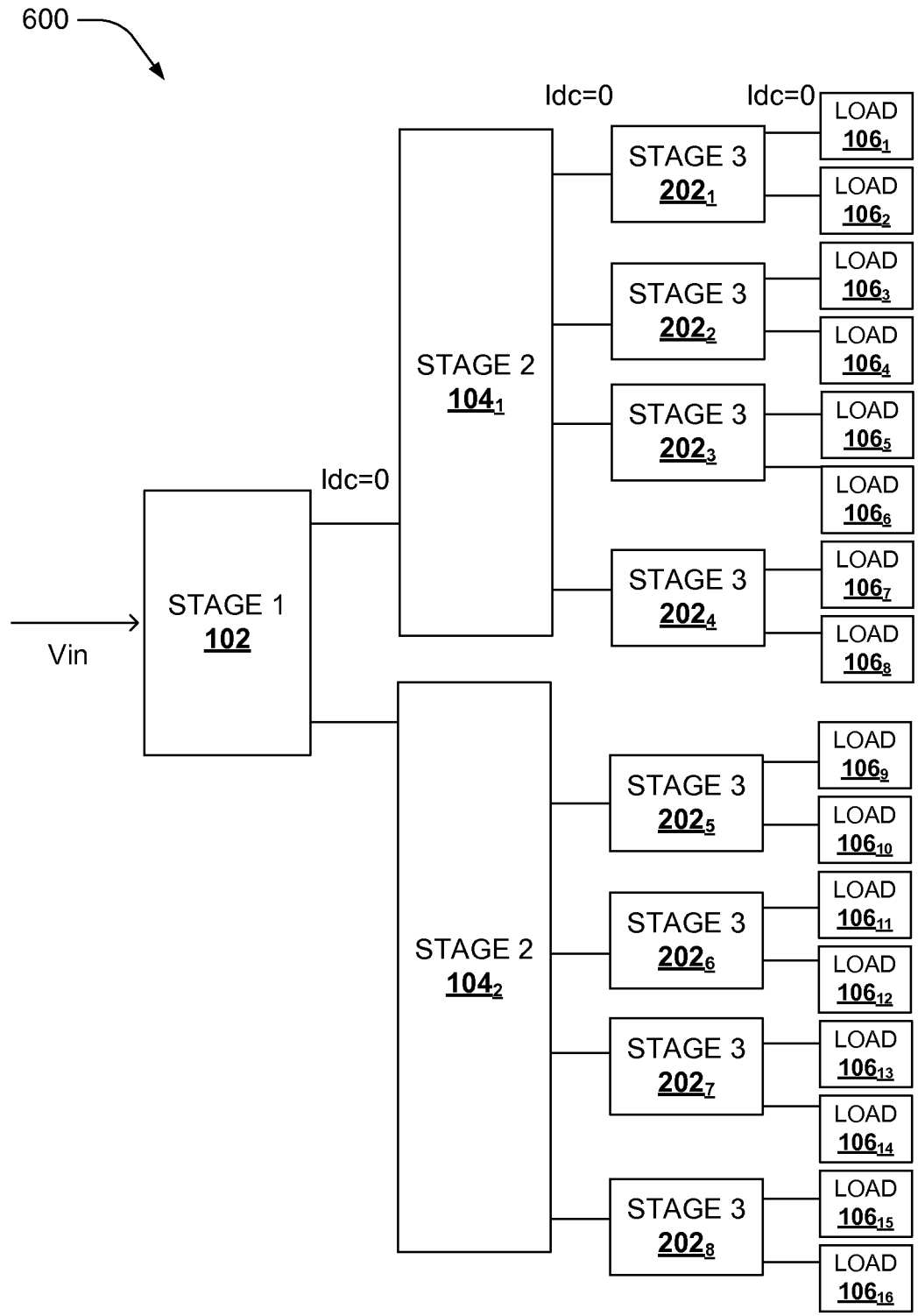
FIG. 6 is a schematic illustration of a multi-stage current-mode interleaver having three interleaver stages, according to an embodiment of the subject disclosure.

Referring now to FIG. 6, illustrated is a schematic diagram of a multi-stage current-mode interleaver 600 having three interleaver stages. The multi-stage current-mode interleaver 600 shows a first interleaver stage 102, second interleaver stage $104_1$ and $104_2$, a third interleaver stage $202_1$-$202_8$, and a load $106_1$-$106_{16}$. As illustrated, the first interleaver stage 102 is an interleaver by two, or an int by 2; the second interleaver stage $104_1$ and $104_2$ is an interleaver by eight, or an int by 8; the third interleaver stage $202_1$-$202_8$ is an interleaver by sixteen, or an int by 16. It will be understood that the first interleaver stage 102, the second interleaver stage $104_1$ and $104_2$ and the third interleaver stage $202_1$-$202_8$ can have any number of interleaver circuits (at least 2) and are not limited by the numbers illustrated. Sixteen loads $106_1$-$106_{16}$ are illustrated but it will be understood that multi-stage current-mode interleaver 600 can have any number of individual loads (at least 1).

FIGS. 7, 8, 9 and 10 show methods illustrated as flow diagrams. For simplicity of explanation, the methods are depicted and described as series of acts. However, the methods are not limited by the acts illustrated and by the order of acts. For example, acts can occur in various orders and/or concurrently, and with other acts not presented and described herein. Furthermore, not all illustrated acts may be required to implement the methods. Additionally, it should be further appreciated that the methods can be implemented on an article of manufacture (e.g., an interleaver) to facilitate transporting and transferring the methods.

Figure 7:
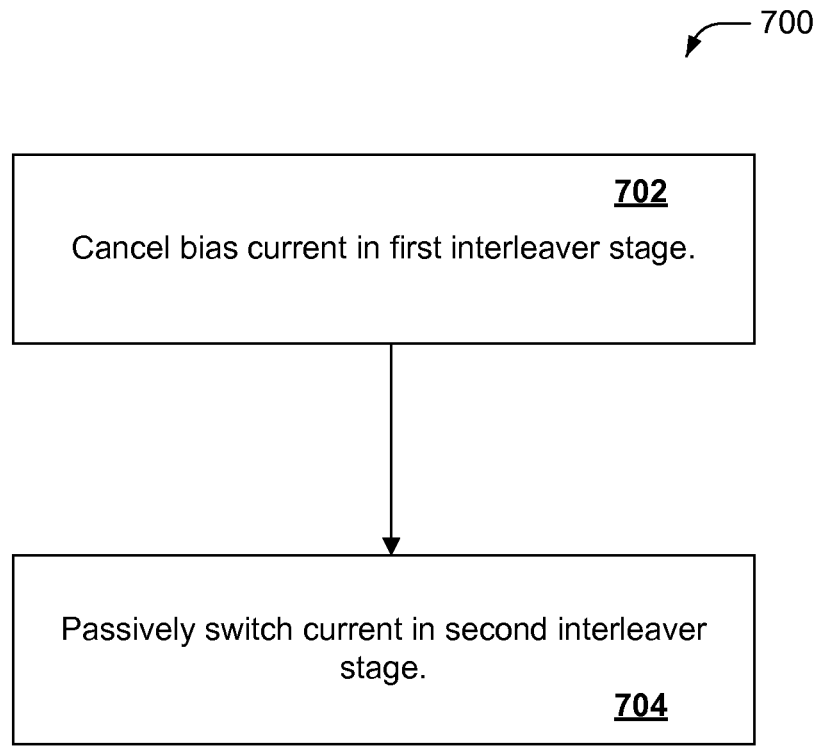
FIG. 7 is a schematic process flow diagram of a method for current switching employing a multi-stage current-mode interleaver, according to an embodiment of the subject disclosure.

Referring now to FIG. 7, illustrated is a schematic process flow diagram of a method 700 for current switching employing an interleaver. At element 702, the biasing current (Idc) is cancelled in a first interleaver stage, which operates in a saturation region to facilitate active current-mode switching. The biasing current can be cancelled by subtracting an input DC biasing current from an output DC current. The biasing current can also be eliminated through employing a transistor with the opposite polarity in the first interleaver stage. It will be understood that the biasing current can be cancelled in any other way that can allow successive interleaver stages not to be subjected to any biasing current (Idc=0). Canceling the biasing current (Idc) allows all successive interleaver stages to work as passive current switches.

At element 704, current is passively switched in a second interleaver stage. The second interleaver stage does not receive any input biasing current (Idc=0) as an input from the first interleaver stage. This allows the second interleaver stage to operate in a linear (or ohmic) region. Operating in the linear (or ohmic) region allows the second interleaver stage to have no voltage drop. Although only two interleaver stages are described herein, it will be understood that an interleaver can have any number of interleaver stages greater than or equal to 2. Each additional interleaver stage operates in the linear region without experiencing any biasing current (Idc), similar to the second interleaver stage.

Figure 8:
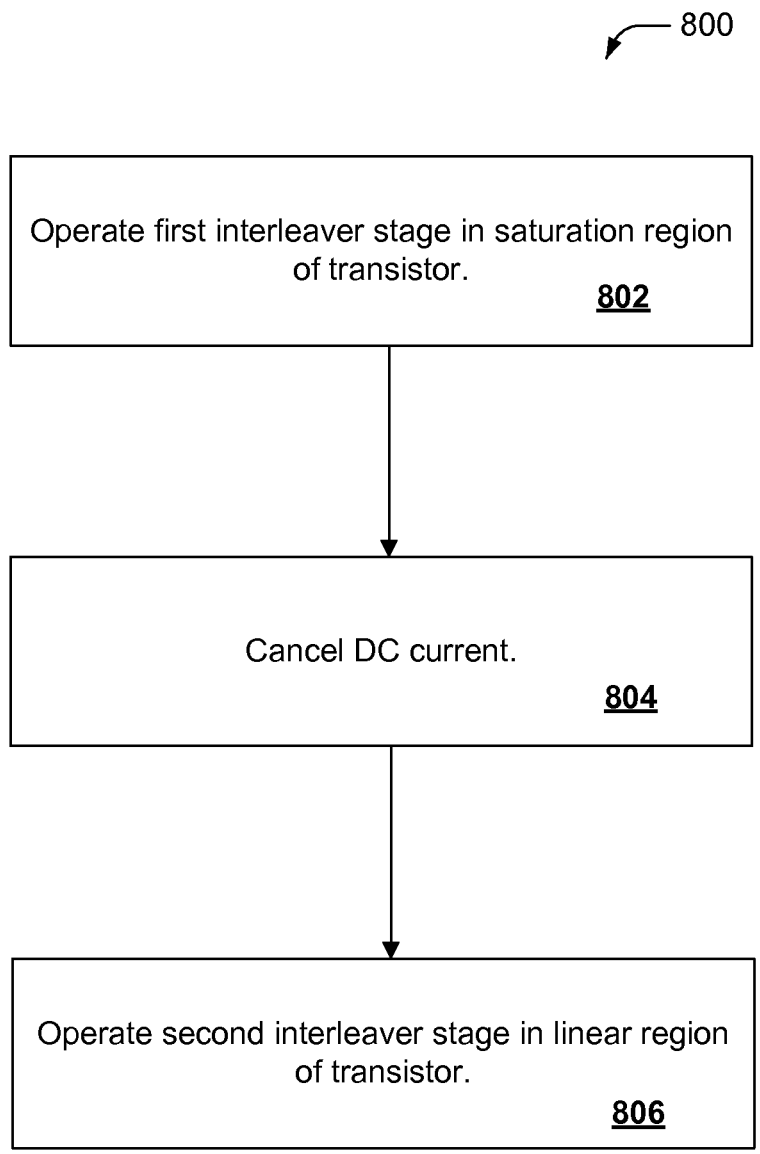
FIG. 8 is a schematic process flow diagram of a method for facilitating high speed low voltage interleaving, according to an embodiment of the subject disclosure.

Referring now to FIG. 8, illustrated is a schematic process flow diagram of a method 800 for facilitating high speed low voltage interleaving. The multi-stage current-mode interleaver includes at least two stages. At element 802, the first interleaver stage is operated in the saturation region of transistors within the first interleaver stage. A DC biasing current is required to ensure that the first interleaver stage operates at an operating point within the saturation region. At element 804, the DC biasing current is cancelled so that successive interleaver stages are not subjected to an input DC current. The DC biasing current can be cancelled, for example, by employing a transistor with an opposite polarity to a transistor within the first interleaver stage.

At element 806, the second interleaver stage is operated in the linear (or ohmic) region of a transistor within the second interleaver stage. The second interleaver stage receives no input DC current and produces no output DC current. Accordingly, there is no voltage drop across the second interleaver stage. The second and subsequent interleaver stages operate in the linear (or ohmic) region without a voltage drop, so the only stage in the interleaver that has a voltage drop is the first interleaver stage. As the only voltage drop is in the first interleaver stage, the supply voltage need only be large enough to compensate for the voltage drop in the first interleaver stage, instead of a voltage drop across successive stages, as in classical current-mode interleavers. The supply voltage required by the multi-stage current-mode interleaver of the subject disclosure 100, 200, 500 or 600 is thus several times less than the supply voltage required by classical current-mode interleavers.

Figure 9:
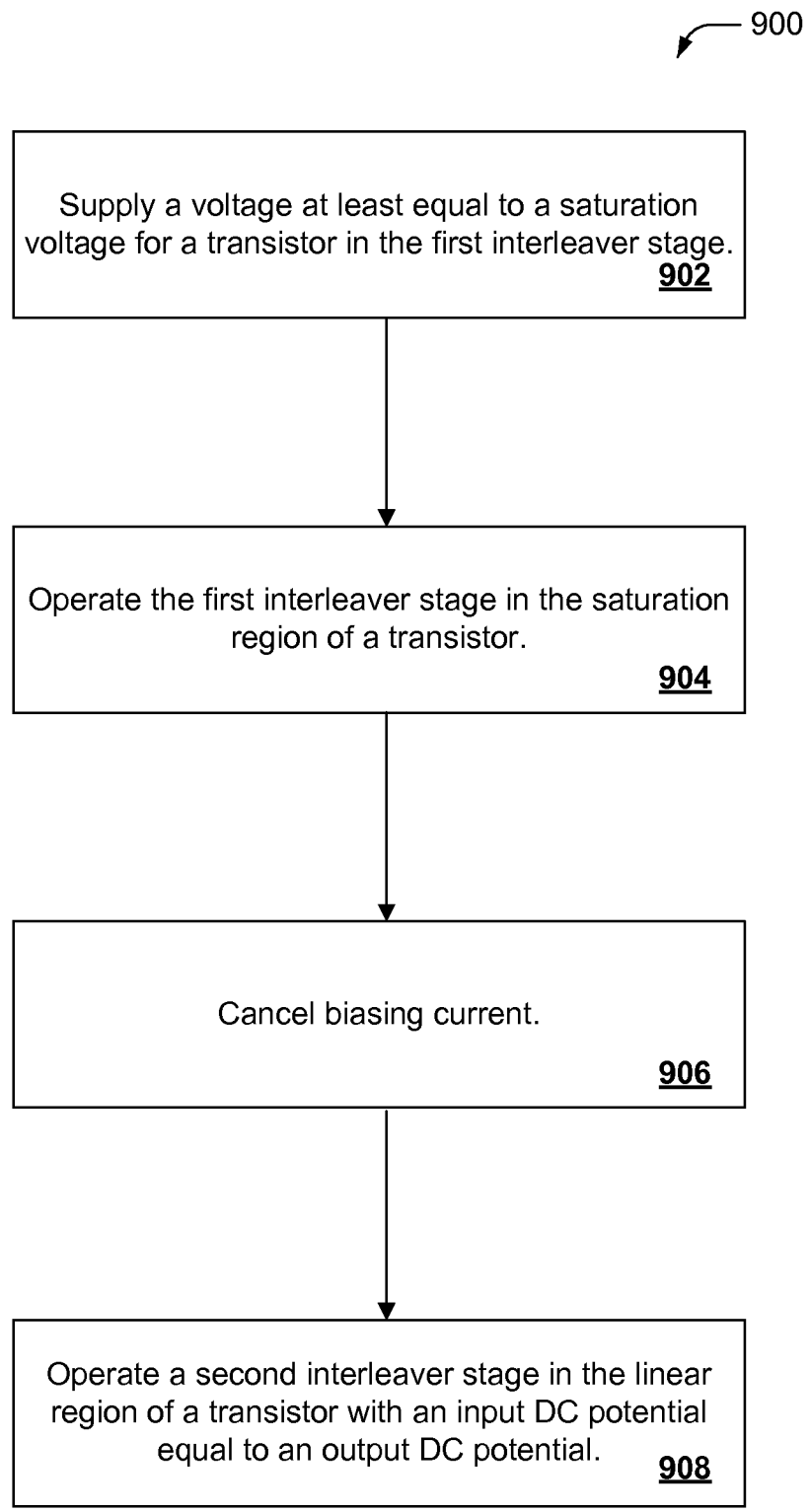
FIG. 9 is a schematic process flow diagram of a method for operating a multi-stage current-mode interleaver with two interleaver stages, according to an embodiment of the subject disclosure.

Referring now to FIG. 9, illustrated is a schematic process flow diagram of a method 900 for operating a multi-stage current-mode interleaver with two interleaver stages. At element 902, a voltage is supplied to a first interleaver stage at least equal to a saturation voltage of the first interleaver stage. The first interleaver stage is biased to operate at an operating point within a saturation region at element 904. Operating in the saturation region (or active mode) allows the first interleaver stage to act as an active current switch.

At element 906, a biasing current (Idc) that is used to drive the first interleaver stage to the operating point within the saturation region is canceled so that successive interleaver stages are not subjected to the biasing current (Idc=0). The biasing current can be cancelled by subtracting an input DC current from an output DC current. The biasing current can also be eliminated through employing a transistor with the opposite polarity. It will be understood that the biasing current can be cancelled in any other way that can allow successive interleaver stages not to be subjected to any biasing current (Idc=0). Canceling the biasing current (Idc) allows all successive interleaver stages to work as passive current switches.

At element 908, a second interleaver stage and all other interleaver stages can be operated in their respective linear regions. An interleaver can have any number of stages greater than or equal to 2. Operating an interleaver stage in a linear region allows all subsequent interleaver stages to have their output DC potentials equal to their respective input DC potentials, which allows subsequent interleaver stages to operate as passive current switches.

The second and subsequent interleaver stages operate in the linear (or ohmic) region without a voltage drop, so the only stage in the interleaver that has a voltage drop is the first interleaver stage. The only voltage drop is in the first interleaver stage, so the supply voltage need only be large enough to compensate for the voltage drop in the first interleaver stage, instead of a voltage drop across successive stages, as in classical current-mode interleavers. The supply voltage required by the multi-stage current-mode interleaver is several times less than the supply voltage required by classical current-mode interleavers.

Figure 10:
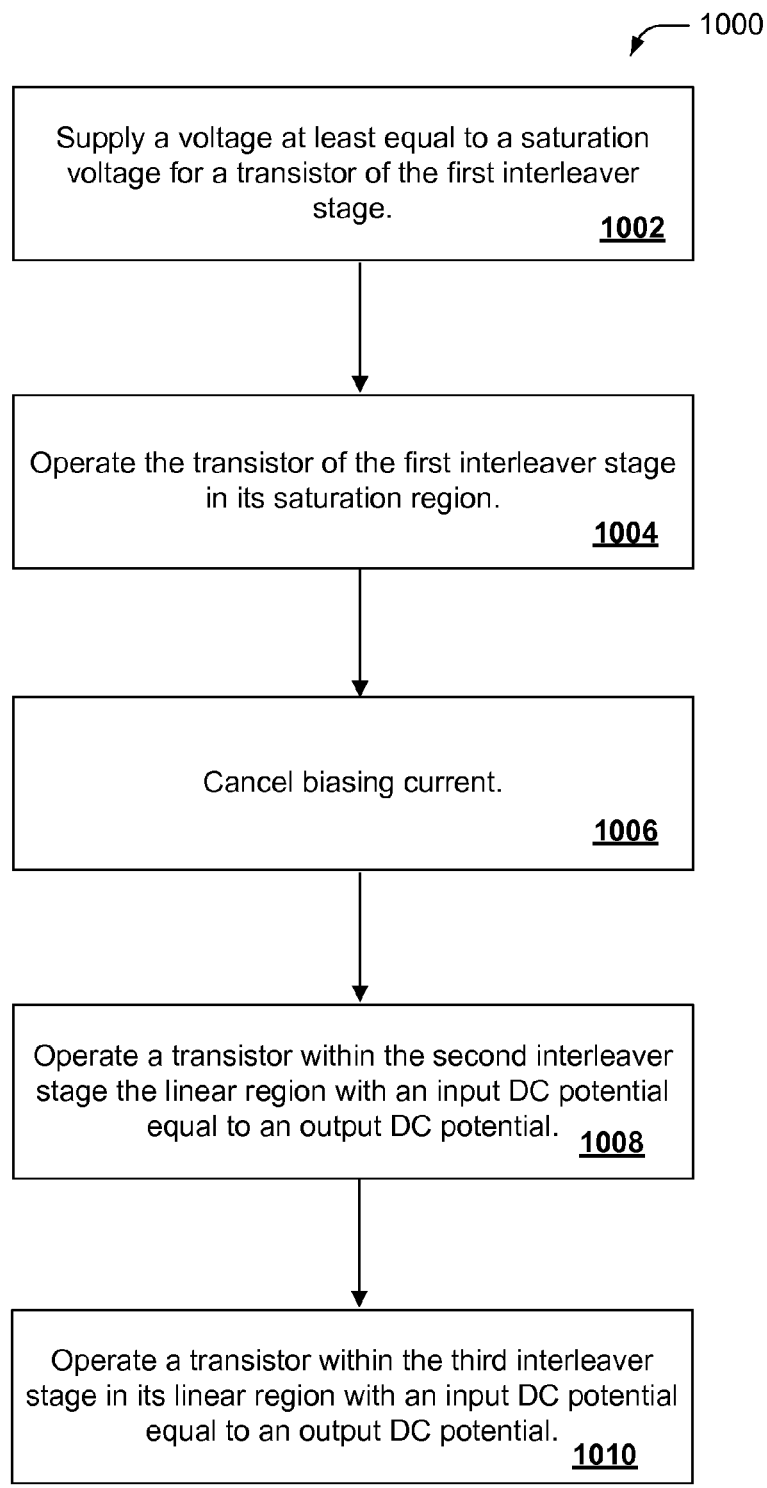
FIG. 10 is a schematic process flow diagram of a method for operating a multi-stage current-mode interleaver with three interleaver stages, according to an embodiment of the subject disclosure.

Referring now to FIG. 10, illustrated is a schematic process flow diagram of a method 1000 for operating a multi-stage current-mode interleaver with three interleaver stages. At element 1002, a voltage is supplied to a first interleaver stage at least equal to a saturation voltage of the first interleaver stage. The first interleaver stage is biased to operate at an operating point within a saturation region of a transistor within the first interleaver stage at element 1004. Operating in the saturation region (or active mode) allows the first interleaver stage to act as an active current switch.

At element 1006, a biasing current (Idc) that is used to drive the first interleaver stage to the operating point within the saturation region is canceled so that successive interleaver stages do not experience the biasing current (Idc=0). The biasing current can be cancelled by subtracting an input DC current from an output DC current. The biasing current can also be eliminated through employing a transistor with the opposite polarity. It will be understood that the biasing current can be cancelled in any other way that can allow successive interleaver stages not to experience any biasing current (Idc=0). Canceling the biasing current (Idc) allows all successive interleaver stages to work as passive current switches.

At element 1008, a second interleaver stage is operated in the linear region. At element 1010, a third interleaver stage is operated in the linear region. All other subsequent interleaver stages, if any, can be operated in the linear region. The interleaver can have any number of interleaver stages (at least 2). Operating in the linear regions allows each interleaver stage subsequent to the first interleaver stage to have an output DC potential equal to an input DC potential. This allows subsequent interleaver stages to operate as passive current-mode switches.

As the second and subsequent interleaver stages operate in the linear (or ohmic) region without a voltage drop, the only stage in the interleaver that has a voltage drop is the first interleaver stage. As the only voltage drop is in the first interleaver stage, the supply voltage need only be large enough to compensate for the voltage drop in the first interleaver stage, instead of a voltage drop across successive stages, as in classical current-mode interleavers. The supply voltage required by the multi-stage current-mode interleaver of the subject disclosure is several times less than the supply voltage required by classical current-mode interleavers.

The above description of illustrated embodiments, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

In this regard, while the described subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. An interleaver circuit, comprising:
a first interleaver stage that is one of operating in a saturation region or blocked; and
a second interleaver stage that is one of operating in a linear region or blocked, wherein the second interleaver stage has an input DC potential equal to an output DC potential and wherein the second interleaver stage is configured to act as a passive current switch.

2. The interleaver circuit of claim 1, wherein the first interleaver stage comprises n transistors, wherein n is at least 2.

3. The interleaver circuit of claim 1, wherein the second interleaver stage comprises n transistors, wherein n is at least 2.

4. The interleaver circuit of claim 1, further comprising: a third interleaver stage that is one of operating in a linear region or is blocked.

5. The interleaver circuit of claim 4, wherein the third interleaver stage comprises n transistors, wherein n is at least 2.

6. The interleaver circuit of claim 1, further comprising: a fourth stage that is a load.

7. The interleaver circuit of claim 1, further comprising: a supply voltage source that provides a supply voltage signal to the interleaver circuit.

8. The interleaver circuit of claim 1, wherein the first interleaver stage facilitates cancellation of a biasing current.

9. The interleaver circuit of claim 7, wherein a voltage of the supply voltage signal is a saturation voltage for the first interleaver stage.

10. An interleaver, comprising:
a first interleaver stage that facilitates cancellation of a biasing current; and
a second interleaver stage that is configured to act as a passive current switch.

11. The interleaver of claim 10, wherein the first interleaver stage is one of operating in a saturation region or blocked.

12. The interleaver of claim 11, wherein the second interleaver stage is one of operating in a linear region or blocked.

13. The interleaver of claim 11, wherein the second interleaver stage has an input DC potential equal to an output DC potential.

14. The interleaver of claim 10, wherein the first interleaver stage comprises n transistors, wherein n is at least 2.

15. The interleaver of claim 10, wherein the second interleaver stage comprises n transistors, wherein n is at least 2.

16. A method, comprising:
operating a first interleaver stage of a multi-stage interleaver circuit in a saturation region; and
operating a second interleaver stage of the multi-stage interleaver circuit in a linear region, wherein the operating the second interleaver stage comprises operating the second interleaver stage as a passive current switch that has an input DC potential equal to an output DC potential.

17. The method of claim 16, further comprising: switching current passively in a third interleaver stage of the multi-stage interleaver circuit.

18. The method of claim 16, further comprising: supplying a supply voltage to the multi-stage interleaver circuit, wherein the supply voltage is at least a saturation voltage for the first interleaver stage.

19. The method of claim 16, wherein the operating the first interleaver stage comprises operating a circuit comprising at least two transistors.

20. The method of claim 16, wherein the operating the second interleaver stage comprises operating a circuit comprising at least two transistors.

* * * * *